(12) United States Patent
Nakano et al.

(10) Patent No.: US 10,008,885 B2
(45) Date of Patent: *Jun. 26, 2018

(54) POWER TRANSMITTING DEVICE, POWER RECEIVING DEVICE, POWER SUPPLY SYSTEM, AND POWER SUPPLY METHOD

(71) Applicant: International Business Machines Corporation, Armonk, NY (US)

(72) Inventors: Daiju Nakano, Sagamihara (JP); Nobuyuki Ohba, Sendai (JP); Kohji Takano, Nakano (JP)

(73) Assignee: International Business Machines Corporation, Armonk, NY (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/682,757

(22) Filed: Aug. 22, 2017

(65) Prior Publication Data

US 2017/0353058 A1    Dec. 7, 2017

Related U.S. Application Data

(63) Continuation of application No. 15/493,354, filed on Apr. 21, 2017, which is a continuation of application
(Continued)

(30) Foreign Application Priority Data

Mar. 27, 2013  (JP) ................ 2013-066617

(51) Int. Cl.
*H04B 5/00*   (2006.01)
*H02J 50/12*  (2016.01)
(Continued)

(52) U.S. Cl.
CPC .......... *H02J 50/12* (2016.02); *G01R 29/0878* (2013.01); *H02J 50/20* (2016.02);
(Continued)

(58) Field of Classification Search
USPC ....................................... 307/107
See application file for complete search history.

(56) References Cited

U.S. PATENT DOCUMENTS

| 9,711,998 B2 | 7/2017 | Nakano et al. |
| 2006/0178142 A1 | 8/2006 | Lovberg et al. |

(Continued)

FOREIGN PATENT DOCUMENTS

| JP | 0715895 A | 1/1995 |
| JP | 07236204 A | 9/1995 |

(Continued)

OTHER PUBLICATIONS

Decision to Grant, Japan Application No. 2015-508205, First Action Allowance, dated Mar. 3, 2016, 6 pgs.
(Continued)

*Primary Examiner* — Rexford Barnie
*Assistant Examiner* — Xuan Ly
(74) *Attorney, Agent, or Firm* — Christopher M. Coy

(57) ABSTRACT

Provided are a power transmitting device, a power receiving device, a power supply system, and a power supply method able to supply electric power by emitting electromagnetic waves. A power transmitting device comprises: a calculating unit for calculating the maximum value for the emitted output of electromagnetic waves meeting exposure standards on the basis of a response delay time measured by the communication link between the power transmitting device and a power receiving device; a power transmitting unit for transmitting power via a power supply link with the power receiving device at an output not exceeding the maximum value; an anomaly detecting unit for detecting an anomaly in the power supply link on the basis of communication with the power receiving device via the communication link; and
(Continued)

an output control unit for controlling the output on the basis of the detection of an anomaly in the power supply link.

1 Claim, 11 Drawing Sheets

Related U.S. Application Data

No. 14/780,432, filed as application No. PCT/JP2014/055033 on Feb. 28, 2014, now Pat. No. 9,711,998.

(51) Int. Cl.
| | | |
|---|---|---|
| H04B 10/079 | (2013.01) | |
| H04B 10/80 | (2013.01) | |
| G01R 29/08 | (2006.01) | |
| H02J 50/20 | (2016.01) | |
| H02J 50/30 | (2016.01) | |
| H02J 50/90 | (2016.01) | |

(52) U.S. Cl.
CPC .............. *H02J 50/30* (2016.02); *H02J 50/90* (2016.02); *H04B 10/07955* (2013.01); *H04B 10/807* (2013.01)

(56) References Cited

U.S. PATENT DOCUMENTS

| | | | | |
|---|---|---|---|---|
| 2006/0266917 | A1* | 11/2006 | Baldis | H01Q 1/248 250/200 |
| 2008/0130124 | A1 | 6/2008 | Graham | |
| 2010/0012819 | A1* | 1/2010 | Graham | H02J 5/00 250/205 |
| 2013/0147573 | A1 | 6/2013 | Yamamoto et al. | |
| 2017/0222487 | A1 | 8/2017 | Nakano et al. | |

FOREIGN PATENT DOCUMENTS

| | | |
|---|---|---|
| JP | 10108386 | 4/1998 |
| JP | 10135915 | 5/1998 |
| JP | 11230856 A | 8/1999 |
| JP | 2008245404 | 10/2008 |
| JP | 2009261156 A | 11/2009 |
| JP | 2010510766 A | 4/2010 |
| JP | 2010166675 A | 7/2010 |
| JP | 4572754 B2 | 11/2010 |
| JP | 5916004 B2 | 5/2016 |
| WO | 2011158283 A1 | 12/2011 |

OTHER PUBLICATIONS

Nakano et al., "Power Transmitting Device, Power Receiving Device, Power Supply System, and Power Supply Method," German Application No. 112014000582.7, filed Feb. 28, 2014, 54 pgs., counterpart of U.S. Appl. No. 14/780,432.
Nakano et al., "Power Transmitting Device, Power Receiving Device, Power Supply System, and Power Supply Method," Japan Application No. 2013-066617, filed Mar. 27, 2013, abandoned Jun. 27, 2014, 38 pgs., counterpart of U.S. Appl. No. 14/780,432.
Nakano et al., "Power Transmitting Device, Power Receiving Device, Power Supply System, and Power Supply Method," Japan Application No. 2015-508205, filed Feb. 28, 2014, 42 pgs., counterpart of U.S. Appl. No. 14/780,432.
Nakano et al., "Power Transmitting Device, Power Receiving Device, Power Supply System, and Power Supply Method," Application No. PCT/JP2014/055033, filed Feb. 28, 2014, 81 pgs., counterpart of U.S. Appl. No. 14/780,432.
International Search Report for PCT/JP2014/055033, dated May 13, 2014, 3 pgs.
Written Opinion of the International Searching Authority, PCT/JP2014/055033, dated May 13, 2014, 7 pgs.
Nakano et al., "Power Transmitting Device, Power Receiving Device, Power Supply System, and Power Supply Method," U.S. Appl. No. 15/682,742, filed Aug. 22, 2017.
Nakano et al., "Power Transmitting Device, Power Receiving Device, Power Supply System, and Power Supply Method," U.S. Appl. No. 15/682,768, filed Aug. 22, 2017.

* cited by examiner

POWER TRANSMITTING DEVICE, POWER RECEIVING DEVICE, POWER SUPPLY SYSTEM, AND POWER SUPPLY METHOD

FIELD OF THE INVENTION

The present invention relates to a power transmitting device, a power receiving device, a power supply system and a power supply method, and more specifically to a power transmitting device, a power receiving device, a power supply system and a power supply method able to transmit electric power by emitting electromagnetic waves.

BACKGROUND

As the speed of wireless data communication increases, more communication performed via land lines is being replaced by wireless communication. However, electric power is supplied by land lines, and wiring needs to be installed to supply power to wireless communication devices. In order to advance the wireless revolution to include both communication and the supply of power, technologies for supplying electric power wirelessly need to be developed.

Non-contact power transmission techniques have gained attention as a way to supply electric power wirelessly, but these techniques supply power using non-emitted energy based primarily on electromagnetic induction. As a result, the power transmission efficiency declines as the distance between the power transmitter and the power receiver increases, and the practical range for this technique extends from several millimeters to several dozen centimeters. Even in the case of the electromagnetic field resonance method, the supply of electric power is limited to short distances of one meter or less. These non-contact techniques are effective at relatively short-distance power supply, but they are no substitute for both indoor and outdoor wiring.

Power transmission techniques via microwaves and laser beams in free space have been researched as another type of non-contact power transmission method. This research has focused primarily on long-distance power transmission techniques between the surface of the earth and outer space, but it will take time to develop practical uses due to problems unique to long-distance power transmission techniques.

Laser power transmission has recently been proposed as a power transmission method for moving objects such as electric vehicles. For example, a laser beam power transmission system, which comprises an electric vehicle which receives a laser beam, converts the laser beam to electric power and uses the resulting power to drive the vehicle, and an electric power supply installed outside of the electric vehicle for supplying the laser beam to the electric vehicle while automatically adjusting for the relative position between the vehicle and the power supply. The laser power transmission technique is a relatively short-distance technique in which a laser beam is emitted from a phase array-type light-emitting device installed in the overhead structure of a bridge or tunnel to a phase array-type light-receiving device installed in the roof of an electric vehicle. These laser power transmission techniques have not been developed for practical use because of problems such as alignment difficulties and inefficiency.

The International Electrotechnical Commission has issued, regarding the safety of laser devices. The international safety standards, and the safety standards of countries that comply with the international standards, regulate laser devices based on indicators known as maximum permissible exposure (MPE) and accessible emission limit (AEL). Laser devices are classified according to these safety standards, and some laser products may be assigned to a class lower than that of the actual power of the laser through technical means employed to limit exposure, such as housings and safety interlocks. DVD devices, Blu-ray (registered trademark) devices and laser printers are products that are marketed in accordance with such safety standards.

Laser devices with output in the 1 W range are also used in laser displays and laser light shows in concert halls. Laser devices which emit a scanning laser beam are classified according to the emission of the scanning laser beam. As a result of scanning failures, such as changes in scanning speed or scanning amplitude, safety precautions have been taken so that exposure exceeding the accessible emission limit (AEL) for a given class does not occur.

A power transmission technique using the emission of electromagnetic waves such as laser beams is desired in order to create truly wireless communication devices able to communicate data at high speeds and receive power wirelessly. However, the emission output has to be increased in order to supply power adequately. Therefore, the development of a technique is desired which can transmit power via the emission of electromagnetic waves at even higher outputs while also meeting exposure standards.

An emergency stop function for the supply of power via light has been disclosed as a configuration in which the presence of optical feedback anomalies is detected via a separate optical fiber housed in the same cable as the optic fiber transmitting the optical power. However, the technique relates to the supply of optical power via wiring, and does not contribute to advancing the wireless revolution to include the supply of electric power.

SUMMARY

Embodiments of the present invention disclose a power transmitting device able to transmit power to a power receiving device by emitting electromagnetic waves. The power transmitting device includes a calculating unit for calculating a maximum value for an emitted output of electromagnetic waves meeting exposure standards on a basis of a response delay time measured by a wireless communication link between the power transmitting device and the power receiving device. The power transmitting device includes a power transmitting unit for transmitting power via a power supply link with the power receiving device at an output not exceeding the maximum value. The power transmitting device includes an anomaly detecting unit for detecting anomalies in the power supply link on the basis of communication with the power receiving device via the wireless communication link. The power transmitting device includes an output control unit for limiting the output on the basis of a detection of an anomaly in the power supply link.

Embodiments of the present invention disclose a power receiving device able to receive electric power supplied from a power transmitting device by emitting electromagnetic waves. The power transmitting device includes a communication device able to communicate so as to establish a response delay time in communication via a wireless communication link between the power receiving device and the power transmitting device. The power transmitting device includes a power receiving device for receiving electric power supplied via a power supply link with the power transmitting device at an emission output of electromagnetic waves not exceeding a maximum value meeting exposure standards, in accordance with the response delay time. The power transmitting device includes a power receiving amount acquiring unit for acquiring the amount of power received by the power receiving device in order to limit the output from the power transmitting device in response to an anomaly occurring in the power supply link.

Embodiments of the present disclosure include a power supply method executed between a power transmitting device able to transmit power by emitting electromagnetic waves, and a power receiving device able to receive power supplied by the power transmitting device. The power supply method includes evaluating a response delay time for communication via a wireless communication link between the power transmitting device and the power receiving device. The power supply method includes calculating a maximum value for an emitted output of electromagnetic waves meeting exposure standards on the basis of the response delay time. The power supply method includes causing, by an output control unit, the power transmitting unit to transmit power via a power supply link with the power receiving device at an output not exceeding the maximum value. The power supply method includes detecting, by an anomaly detecting unit, the anomaly in the power supply link on the basis of communication with the power receiving device via the wireless communication link. The power supply method includes causing the power supply device to limit the output of the power supply link on the basis of the detection of the anomaly in the power supply link.

Embodiments of the present invention disclose a power supply system including a power transmitting device able to transmit power by emitting electromagnetic waves, and a power receiving device able to receive power supplied by the power transmitting device. The power transmitting device includes a calculating unit for calculating a maximum value for an emitted output of electromagnetic waves meeting exposure standards on the basis of a response delay time measured by a wireless communication link between the power transmitting device and the power receiving device. The power transmitting device includes a power transmitting unit in the power transmitting device for transmitting power via a power supply link with the power receiving device at an output not exceeding the maximum value. The power transmitting device includes an anomaly detecting unit for detecting anomalies in the power supply link on the basis of communication with the power receiving device via the wireless communication link. The power transmitting device includes an output control unit in the power transmitting device for limiting the output on a basis of a detection of an anomaly in the power supply link.

BRIEF DESCRIPTION OF THE DRAWINGS

FIG. 3 is a diagram used to explain the laser output control method.

DETAILED DESCRIPTION

Problem Solved by the Invention

Figure 1:
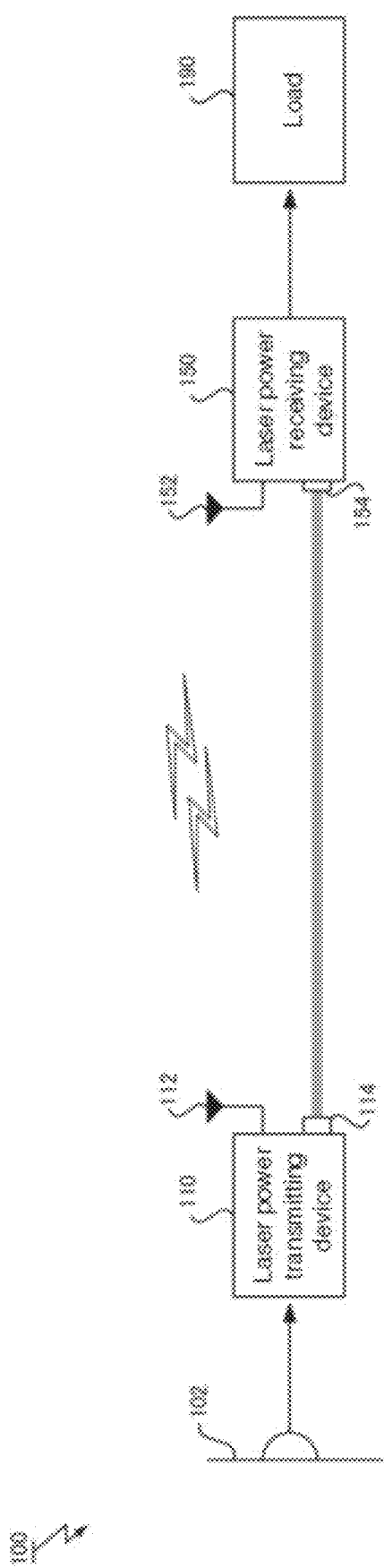
FIG. 1 is a schematic diagram showing a laser power supply system according to an embodiment of the present invention.

The present invention was devised in view of the insufficiencies of the prior art, and it is an object of the present invention to provide a power transmitting device, an power receiving device, a power supply system, and a power supply method able to transmit power via the emission of electromagnetic waves while also meeting predetermined standards for exposure premised on the occurrence of anomalies. It is another object of the present invention to provide a power transmitting device, a power receiving device, a power supply system, and a power supply method able to further improve safety.

Means of Solving the Problem

In order to solve these problems, the present invention provides a power transmitting device able to transmit power to a power receiving device by emitting electromagnetic waves. This power transmitting device has the following characteristics. The power transmitting device calculates the maximum value for the emitted output of electromagnetic waves meeting exposure standards on the basis of a response delay time measured by the communication link between the power transmitting device and the power receiving device. The power transmitting device also transmits power via a power supply link with the power receiving device at an output not exceeding the maximum value. In addition, the power transmitting device detects anomalies in the power supply link on the basis of communication with the power receiving device via the communication link, and limits the emission output of electromagnetic waves on the basis of the detection of anomalies in the power supply link.

The present invention also provides a power receiving device able to receive electric power supplied from a power transmitting device by emitting electromagnetic waves. This power receiving device has the following characteristics. The power receiving device is able to communicate so as to evaluate the response delay time in communication via the communication link between the power receiving device and the power transmitting device. The power receiving device also receives electric power supplied via a power supply link with the power transmitting device at an emission output of electromagnetic waves not exceeding the maximum value meeting exposure standards, in accordance with the response delay time. In addition, the power receiving device acquires the amount of power received by the power receiving device in order to limit the output from the power transmitting device in response to an anomaly occurring in the power supply link.

The present invention further provides a power supply system including a power transmitting device able to transmit power by emitting electromagnetic waves, and a power receiving device able to receive power supplied by the power transmitting device.

In addition, the present invention provides a power supply method executed between a power transmitting device able to transmit power by emitting electromagnetic waves, and a power receiving device able to receive power supplied by the power transmitting device. This power supply method includes the steps of evaluating the response delay time for communication via the communication link between the power transmitting device and the power receiving device, calculating the maximum value for the emitted output of electromagnetic waves meeting exposure standards on the basis of the response delay time, and transmitting power using the power transmitting unit via a power supply link with the power receiving device, at an output not exceeding the maximum value. The power supply method also includes the steps of detecting anomalies in the power supply link on the basis of communication with the power receiving device via the communication link, and causing the power supply device to limit the output of the power supply link on the basis of the detection of an anomaly in the power supply link.

Effect of the Invention

The configuration described above is able to transmit power via the emission of electromagnetic waves while also meeting predetermined standards for exposure premised on the occurrence of anomalies.

The following is an explanation of preferred embodiments of the present invention, but the present invention is not limited to the embodiments explained below. In the embodiments explained below, an example of a power transmitting device, a power receiving device and a power supply system are explained using laser power transmitting device 110, laser power receiving device 150, and laser power supply system 100.

FIG. 1 is a schematic diagram showing a laser power supply system 100 according to an embodiment of the present invention. The laser power supply system 100 in the present embodiment includes a laser power transmitting device 110, and a laser power receiving device 150 installed at a location some distance from the laser power transmitting device 110.

The laser power transmitting device 110 includes a laser element 114, and receives a supply of power from a power source 102, and emits a laser beam from the laser element 114 to transmit electric power wirelessly to the laser power receiving device 150. The laser power receiving device 150 includes a photoelectric conversion element 154, and receives the laser beam emitted by the laser power transmitting device 110 via the photoelectric conversion element 154 to receive electric power wirelessly.

Here, the link established between the laser power transmitting device 110 and the laser power receiving device 150 to supply electric power is referred to as the wireless power supply link. The wireless power supply link is established between the laser power transmitting device 110 and the laser power receiving device 150 by aligning the laser emission direction so that the laser beam emitted by the laser element 114 is properly incident on the photoelectric conversion element 154. In the present embodiment, the wireless power supply link is not defined by a waveguide, but by the optical path of a laser beam propagated through the air.

The laser emission described above can be monochromatic electromagnetic waves such as infrared, visible or ultraviolet light, or a mixture of these electromagnetic waves. In the explanation of the present embodiment, power is supplied via laser emission. However, the electromagnetic waves emitted to supply power are not limited to laser beams. In another embodiment, power may be supplied via the emission of electromagnetic waves in another waveband, such as microwaves.

The laser power receiving device 150 supplies the received electric power to a load 190 connected externally or incorporated internally. There are no particular limitations on the load 190. It can be any device or component that consumes or stores electric power, such as a projector, monitoring camera, or secondary battery.

The laser power transmitting device 110 and laser power receiving device 150 in the present invention are provided with antennas 112 and 152, respectively, which are configured to establish wireless data communication. Here, the link established between the laser power transmitting device 110 and the laser power receiving device 150 for the communication of data is referred to as the wireless communication link. The wireless communication link is different from the wireless power supply link mentioned above. The wireless communication link preferably has high directionality. However, the wireless power supply link typically has higher directionality than the wireless communication link. In a preferred embodiment, the wireless communication link uses electromagnetic waves (millimeter waves) in a frequency band of several dozen GHz (typically 60 GHz) to realize data communication rates in excess of several Gbps.

There are no particular restrictions on antennas 112 and 152. However, in a preferred embodiment, an antenna with controllable directionality is employed, such as an active array antenna in which a plurality of antennas is arranged. In the wireless communication link, the laser power transmitting device 110 and the laser power receiving device 150 are able to exchange data as either transmitter or receiver.

The laser power transmitting device 110 shown in FIG. 1 controls the emitted laser output and wirelessly supplies electric power to the laser power receiving device 150 while exchanging information with the laser power receiving device 150 via data communication in the wireless communication link. The distance between the laser power transmitting device 110 and the laser power receiving device 150 depends on the directionality of the laser beam and wireless electromagnetic waves, and the environment in which the devices are being used. This distance can be any distance within a range in which the laser beam can effectively transmit an adequate amount of power and in which wireless data communication can be maintained at an adequate rate.

The laser device in the laser power transmitting device 110 is subject to international standards regarding the safety of laser devices ("Safety of Laser Products—Part 1: Equipment classification, requirements, and user's guide" IEC 60825-1) and domestic safety standards that comply with these international standards (JIS C 6802).

In the JIS C 6802 standards, "Class 1 laser products" are defined as "all laser products which, during operation, do not expose the human body to laser emissions in excess of the Class 1 accessible emission limit (AEL) relative to wavelength and emission duration"). Here, "emission duration" is defined as "the duration of pulses, pulse trains or continuous emission of a laser to which the human body is exposed as a result of operating, maintaining or servicing a laser device." In the case of a single pulse, the emission duration is the span of time between the rising edge half-point and the falling edge half-point of the pulse. In the case of a continuous pulse train (or a group of sub-pulses in the main pulse train), the emission duration is the span of time between the rising edge half-point of the initial pulse and the falling edge half-point of the final pulse.

The "accessible emission limit (AEL)" is defined as the "maximum exposure permitted for each class," and "accessible emission" is defined as "the emission level defined at a given position using a specified aperture stop [when the AEL is provided in watts (W) or joules (J)] or using a limiting aperture [when the AEL is provided in watts per square meter ($W \cdot m^{-2}$) or joules per square meter ($J \cdot m^{-2}$)]. The maximum permissible exposure (MPE) is defined as "the level of laser exposure in a normal environment which does not cause harm to an exposed human body." The "MPE level" is "the maximum level at which exposure causes no immediate or long-term damage to eyes and skin." The accessible emission limit (AEL) is generally derived from the maximum permissible exposure (MPE).

In the laser power supply system 100 shown in FIG. 1, a laser beam propagates in the air from the laser power transmitting device 110 to the laser power receiving device 150. When, at this time, an obstacle comes between the laser power transmitting device 110 and the laser power receiving device 150 and blocks the optical path, the laser beam may be emitted outside of the optical path due, for example, to reflection on the surface of the obstacle. The obstacle itself may also be exposed to the laser beam. Therefore, immediately after the occurrence of an anomaly, such as an obstacle blocking the optical path, controls are required to reduce the emission level that may occur during the reaction time below a predetermined reference level until the laser output has been sufficiently restricted.

Therefore, in the laser power supply system 100 in the present embodiment, any anomaly occurring in the wireless power supply link and wireless communication link is detected on the basis of data communication via the wireless communication link while power is being transmitted via the power supply link within a predetermined output range, and the laser output is restricted in response to the occurrence of an anomaly. The following is a detailed explanation of the power supply method executed by the power transmitting device 110 and power receiving device 150 in the present embodiment with reference to FIG. 2 through FIG. 10.

Figure 2:
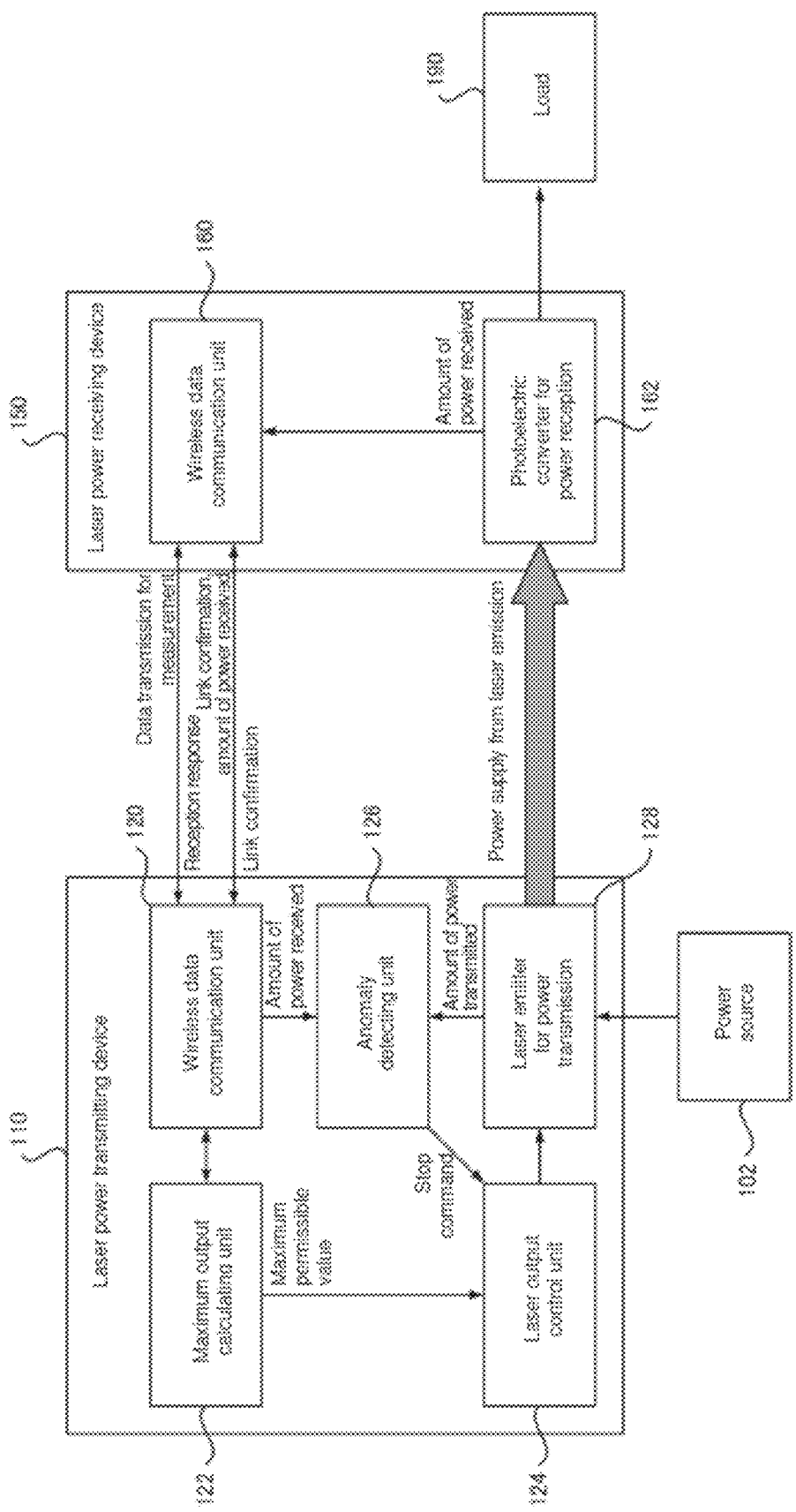
FIG. 2 is a diagram showing the function blocks and data flow for a laser power transmitting device and laser power receiving device in a laser power supply system according to an embodiment of the present invention.

FIG. 2 is a diagram showing the function blocks and data flow for a laser power transmitting device 110 and laser power receiving device 150 in a laser power supply system 100 according to an embodiment of the present invention. The laser power transmitting device 110 shown in FIG. 2 includes a wireless data communication unit 120, a maximum output calculating unit 122, a laser output control unit 124, an anomaly detecting unit 126, and a laser emitter for power transmission 128. The laser power receiving device 150 shown in FIG. 2 includes a wireless data communication unit 160 and a photoelectric converter for power reception 162.

Wireless data communication units 120 and 160 in the laser power transmitting device 110 and the laser power receiving device 150, respectively, are wireless communication interfaces for bidirectional wireless data communication. During reception, wireless data communication units 120 and 160 receive carrier waves propagated through the air via antenna 112 and 152, respectively, and restore the received data on the basis of a predetermined modulation scheme. During transmission, the wireless data communication unit 120 modulates the transmitted data on the basis of a predetermined modulation scheme, and emits the signals through the air as carrier waves. There are no particular restrictions on the modulation scheme. Examples of modulation schemes include M-ary Phase Shift Keying (MPSK) and M-ary Quadrature Amplitude Modulation (MQAM).

The laser emitter for power transmission 128 in the laser power transmitting device 110 typically includes a GaAs, InGaAs or InGaAsP semiconductor laser element. However, in another embodiment, the laser element 114 may use a gas laser or solid-state laser. The mode of operation for the laser element may be a continuous wave (CW) mode of operation or a pulsed wave mode of operation. There are no particular restrictions on the laser emitting wavelength of the laser element.

The photoelectric converter for power reception 162 in the laser power receiving device 150 includes a photoelectric conversion element that photoelectrically converts the received laser beam to generate electromotive force. The photoelectric conversion element may be a photodiode or solar cell having high conversion efficiency with respect to the wavelength of the laser emitted by the laser emitter for power transmission 128.

The maximum output calculating unit 122 evaluates the response delay time observed in the wireless communication link between the power transmitting device 110 and the power receiving device 150, and calculates the maximum value (maximum permissible value) for the laser emission output that meets allowable exposure standards on the basis of the evaluated response delay time. Here, the maximum permissible value for the laser emission output is calculated so as not to exceed a predetermined standard exposure level when the laser is emitted at the output of the maximum permissible value for the duration of the reaction time required for the laser output to be limited to a sufficiently low level after the occurrence of an anomaly.

In the present embodiment, any anomaly that has occurred in the wireless power supply link is detected on the basis of data communication via the wireless communication link. Therefore, the reaction time depends on the response delay time (latency) of the data communication between the power transmitting device 110 and the power receiving device 150 via the wireless communication link. More specifically, the reaction time includes the response delay time that passes during data communication for detecting anomalies, the time required to detect an anomaly on the basis of transmitted data, the time required for the laser output to be reduced to below a predetermined level after anomaly detection, and a predetermined time margin. Typically, the response delay time for wireless communication is predominant.

The maximum permissible value calculated under these conditions is the maximum allowable output value which guarantees that the emission level that may be emitted during the response time is below a predetermined reference level in accordance with the response delay time. Therefore, if the laser is emitted at an output that does not exceed this maximum permissible value, from the time an anomaly occurs until output control is performed, the laser beam is kept from exposing the obstacle at a level exceeding the exposure standard or being emitted outside the optical path, even when an anomaly has occurred in the wireless power supply link. The maximum permissible value can be increased as the response time becomes shorter to enable the supply of power at a higher output.

For the response delay time, the time required to transmit data of a known length (for example, measurement data) can be measured, the data transfer rate can be calculated based on the required time, and the response delay time can be evaluated based on the data transfer rate. The response delay time thusly evaluated depends on the communication method used in anomaly detection, but round-trip latency or one-way latency can also be used. In the present embodiment, the maximum permissible value may be calculated from the response delay time or data transfer rate using a predetermined equation, or may be obtained by referencing a table associating response delay times or data transfer rates with maximum permissible values.

When the relative positional relationship of the power transmitting device 110 and the power receiving device 150 is fixed, the evaluation of the response delay time and the calculation of the maximum permissible value may typically be performed one time before establishing a wireless power supply link and supplying power. However, when the relative positional relationship is variable, the evaluation of the response delay time and the calculation of the maximum permissible value based on the evaluated response delay time may be repeated at a suitable frequency. In this situation, the data transmission rate can be measured via data communication for anomaly detection, and the latest calculated maximum permissible value used.

The laser output control unit 124 is used to control the operation of the laser emitter for power transmission 128, and controls the laser output based on the maximum permissible value for the laser output calculated by the maximum output calculating unit 122 so as not to exceed the maximum permissible value. The laser output control unit 124 can increase the laser output in stages from zero to the maximum permissible value while confirming the amount of power received on the power receiving end on the basis of data communication via the wireless communication link.

The laser emitter for power transmission 128 is configured as a power transmitting unit which, under the control of the laser output control unit 124, emits the laser and transmits power to the laser power receiving device 150 at an output that does not exceed the maximum permissible value. There are no particular restrictions on the laser output control method.

Figure 3:
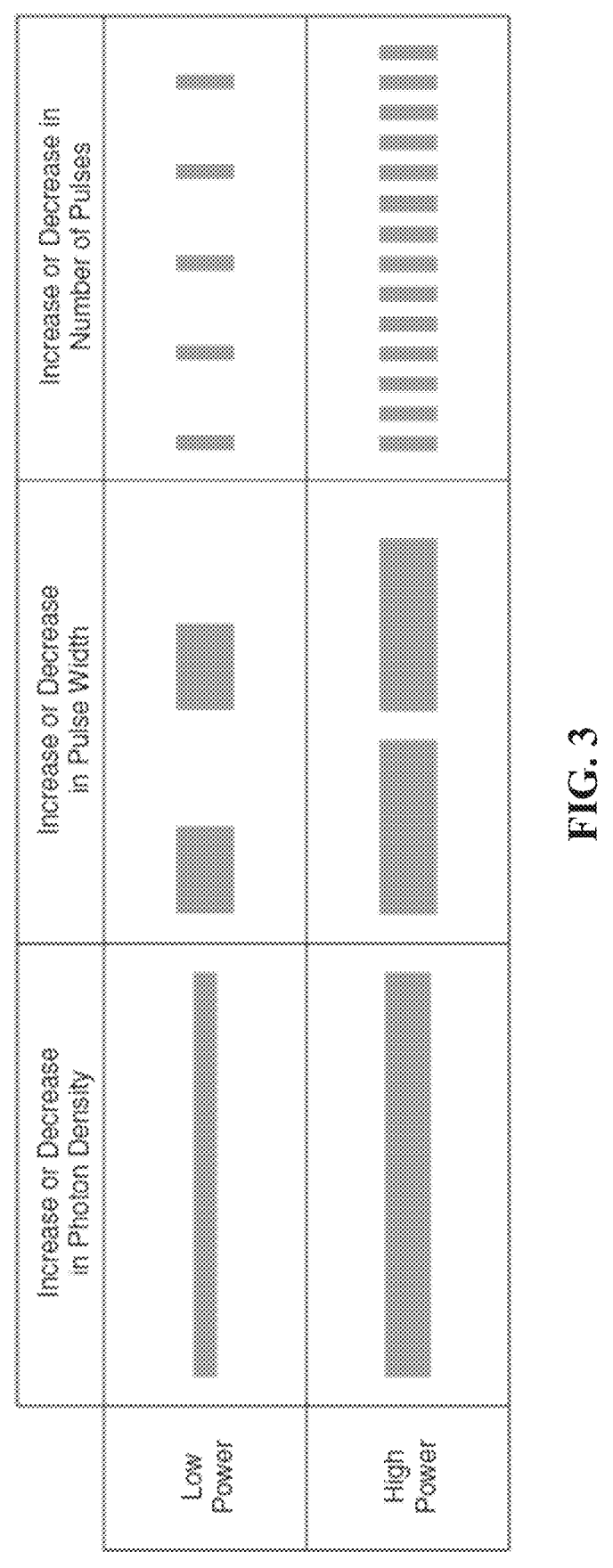

FIG. 3 is a diagram used to explain the laser output control method. As shown in the left-hand column of the table shown in FIG. 3, during continuous laser emission, the power of the laser emission can be increased or decreased using the photon density. As shown in the central and right-hand columns of the table in FIG. 3, during laser pulse emission, the power of the laser emission can be increased or decreased using the pulse width (duty ratio) in a predetermined pulse phase or can be increased or decreased using the pulse phase or pulse frequency (number of pulses per unit of time).

The anomaly detecting unit 126 can monitor the state of the wireless power supply link and detect the occurrence of an anomaly on the basis of data communication with the laser power receiving device 150 via the wireless communication link. An anomaly can be detected by taking into account the conversion efficiency of both device 110 and 150, and comparing the amount of power (electric power) transmitted by the laser power transmitting device 110 and the amount of power (electric power) received by the laser power receiving device 150.

When the difference or ratio of emitted power received by the laser power receiving device 150 (received power/photoelectric conversion efficiency) relative to the emitted power transmitted by the laser power transmitting device 110 (inputted power×photoelectric conversion efficiency, or known emitted power at a set output value) is outside of a predetermined criterion, a loss of power for reasons which cannot be ignored is suggested, and the occurrence of an anomaly in the wireless power supply link can be determined. This loss typically occurs because of the optical path being blocked by an obstacle, contamination of the optical path by smoke or dust which causes scattering and diffuse reflection, misalignment of the laser, or deterioration or failure of the photoelectric conversion element. When such an anomaly occurs, limiting the laser output is preferred from a management standpoint.

In the embodiment shown in FIG. 2, the amount of received power is acquired by the photoelectric converter for power reception 162 serving as the amount of received power acquiring unit in the laser power receiving device 150, and the acquired amount of power received is reported to the laser power transmitting device 110 by the wireless data communication unit 160. The anomaly detecting unit 126 in the laser power transmitting device 110 acquires the amount of power transmitted from the laser emitter for power transmission 128, and compares the amount of power received which was reported by the laser power receiving device 150 to the acquired amount of power transmitted while taking into account conversion efficiency. When the results of the comparison indicate the occurrence of loss equal to or greater than a predetermined threshold value, it is determined that an anomaly has occurred in the wireless power supply link.

The anomaly detecting unit 126 can also detect anomalies in the wireless communication link in addition to detecting anomalies in the wireless power supply link by comparing the amount of power received to the amount of power transmitted. Anomalies that can occur in the wireless communication link include an interruption in the wireless communication link itself, a rapid decline in the signal-to-noise ratio (SNR), and rapid changes in the beam direction of an adaptively controlled antenna.

In the present embodiment, an anomaly is detected in the wireless power supply link using the wireless communication link. Therefore, any of these anomalies can obstruct anomaly detection in the wireless power supply link. When the anomaly detecting unit 126 in the present embodiment has detected the occurrence of an anomaly in at least one of the wireless communication link and the wireless power supply link, a laser output limiting command, more specifically, a laser output stop command, is quickly issued to the laser output control unit 124.

In response to a command due to detection of an anomaly in the wireless power supply line or wireless communication link, the laser output control unit 124 serves as an output control unit to reduce the output of the laser emitted from the laser emitter for power transmission 128 below a reference level. More specifically, the laser output control unit 124 responds to a laser output stop command by immediately stopping the flow of operating current to the laser element in the laser emitter for power transmission 128, thereby stopping emission of the laser.

Figure 4:
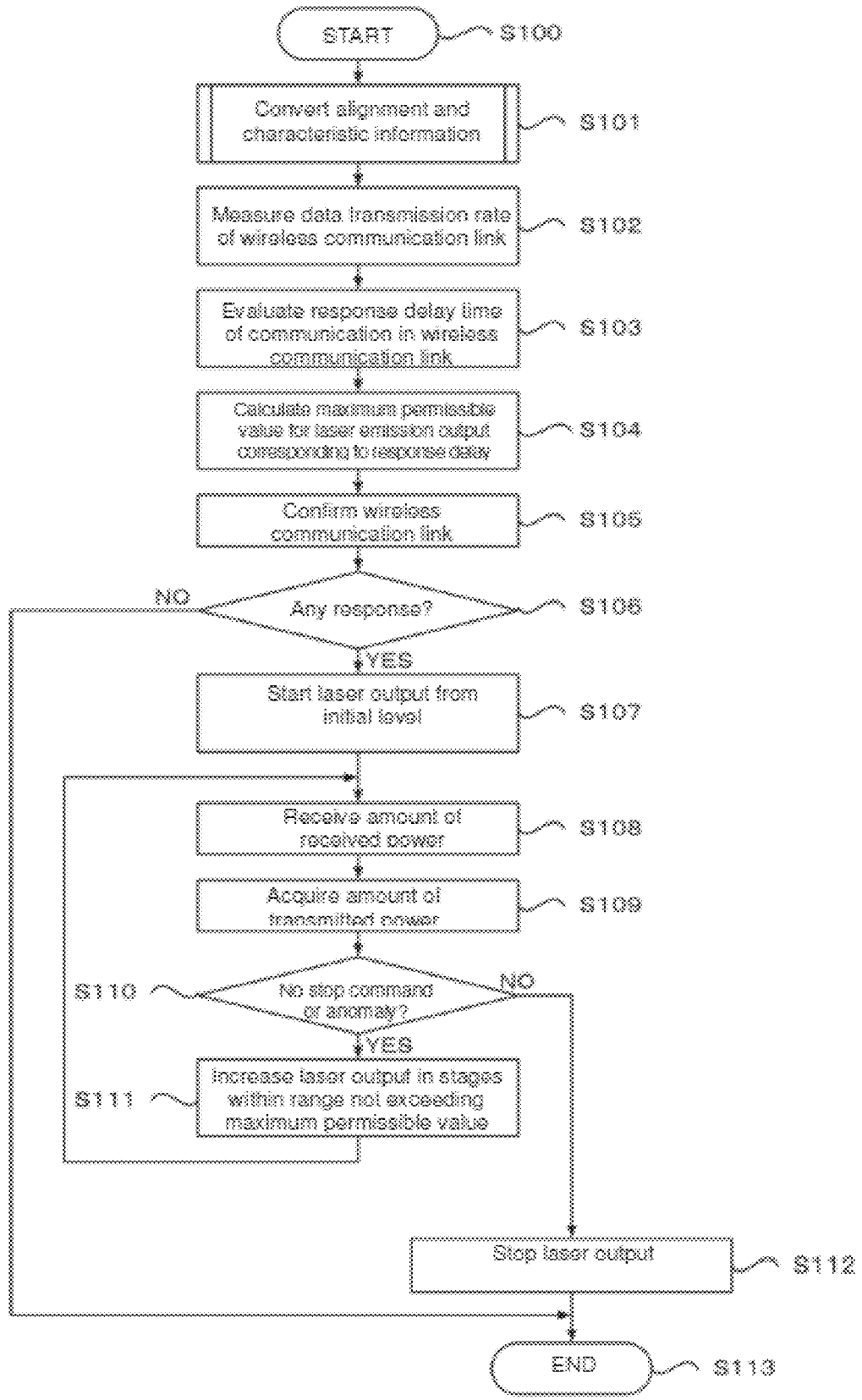
FIG. 4 is a flowchart showing the controls executed by the laser power transmitting device according to an embodiment of the present invention.
Figure 5:
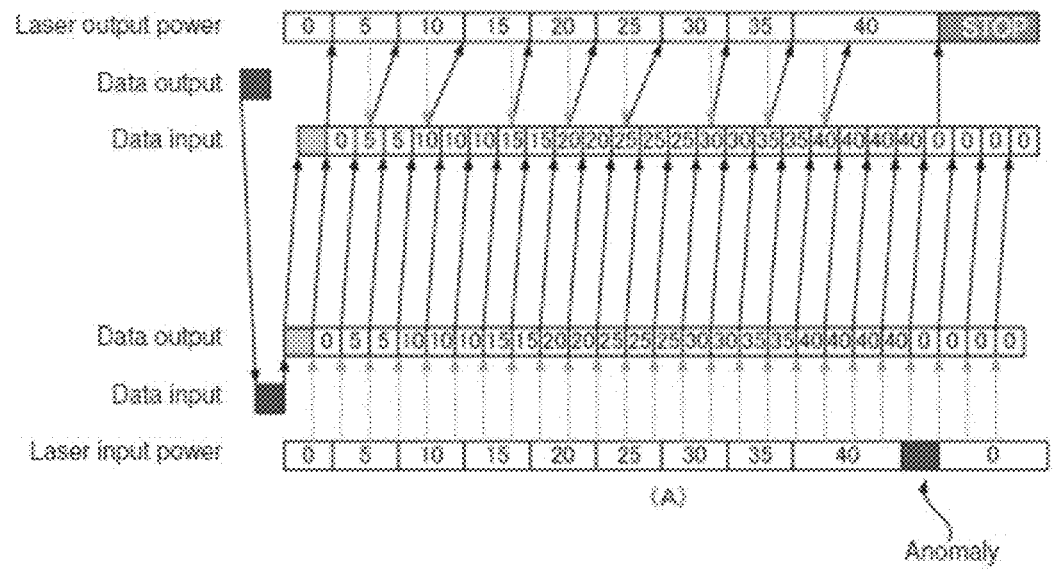
FIG. 5 is a diagram schematically illustrating the relationship to laser output of the exchange of information between the laser power transmitting device and the laser power receiving device and the timings thereof in an embodiment of the present invention.
Figure 5:
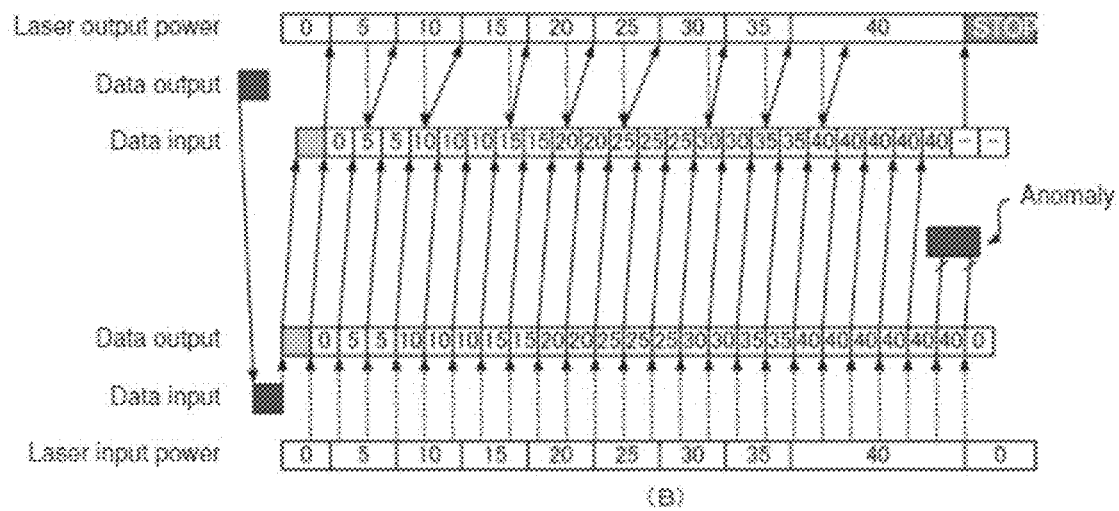

The following is a detailed explanation of the operations performed when power is supplied in the laser power supply system 100 described above with reference to FIG. 4 and FIG. 5. FIG. 4 is a flowchart showing the controls executed by the laser power transmitting device 110 according to an embodiment of the present invention. FIG. 5 is a diagram schematically illustrating the relationship to laser output of the exchange of information between the laser power transmitting device 110 and the laser power receiving device 150 and the timings thereof in an embodiment of the present invention.

The controls shown in FIG. 4 start from Step S100, for example, in response to an operator starting the laser power transmitting device 110. In Step S101, the laser power transmitting device 110 exchanges alignment and characteristic information (type of power-transmitting laser, conversion efficiency, etc.) of the wireless communication link and wireless power supply link with the laser power receiving device 150. The alignment process is explained in greater detail below.

In Step S102, the laser power transmitting device 110 performs data communication using the wireless data communication unit 120, and calculates the data transmission rate of the wireless communication link using the maximum output calculating unit 122. In Step S103, the laser power transmitting device 110 evaluates the response delay time observed in communication via the wireless communication link on the basis of the data transmission rate measured by the maximum power calculating unit 122. In Step S104, the laser power transmitting device 110 uses the maximum output calculating unit 122 to calculate the maximum permissible value for laser output in response to the evaluated response delay time.

In Step S105, the laser power transmitting device 110 uses the wireless data communication unit 120 to output a wireless communication link confirmation to the laser power receiving device 150 (indicated by the black squares in FIG. 5). After receiving the link confirmation, the laser power receiving device 150 outputs a wireless communication link response to the laser power transmission device 110 (indicated by the gray squares in FIG. 5). In Step S106, the laser power transmitting device 110 determines whether or not there has been a link response to the link confirmation. When it has been determined in Step S106 that there has been no link response (NO), it is treated as an anomaly or error in the wireless communication link, and the control process is ended in Step S113 without beginning laser output.

When it has been determined in Step S106 that there has been a link response (YES), the control process advances to Step S107. In Step S107, the laser power transmitting device 110 sets the calculated maximum permissible value, and begins laser emission from the laser emitter for power transmission 128 under the control of the laser control unit 124 from the initial level.

In Step S108, the laser power transmitting device 110 receives the amount of power received (indicated by the numbered squares in FIG. 5) which is transmitted from the laser power receiving device 150 using the wireless data communication unit 120 following the link response. In Step S109, the laser power transmitting device 110 acquires the amount of transmitted power from the laser emitter of power transmission 128. In Step S110, the laser power transmitting device 110 uses the anomaly detecting unit 126 to determine whether or not an anomaly has occurred in one of at least the wireless power supply link and wireless communication link. When no anomaly has been determined in Step S110 (YES), the control process advances to Step S111.

In Step S111, the laser power transmitting device 110 uses the laser output control unit 124 to increase the laser output in stages within a range that does not exceed the maximum permissible value, and loops the control process to Step S108. FIG. 5 shows the amount of power receiving being continuously transmitted from the laser power receiving device 150 to the laser power transmitting device 110, and the laser output being increased in stages based on the results of a comparison between the amount of power received and the amount of power transmitted.

When the presence of an anomaly has been determined in Step S110 (NO), the control process branches to Step S112. When no notification of the amount of power received has been received (an anomaly on the wireless communication link) or the loss from the comparison of the amount of power received to the amount of power transmitted exceeds a predetermined reference level (an anomaly in the wireless power supply link), it is determined that there has been an anomaly. Here, the control process may branch to Step S112 even when there is an explicit stop command from the operator.

In Step S112, the laser power transmitting device 110 uses the laser output control unit 124 to block the supply of drive current to the laser element to stop oscillation of the laser, and ends the control process in Step S113.

FIG. 5 (A) shows the processing flow from the detection of an anomaly that has occurred due to an interruption in the wireless power supply link to the stopping of the laser. As shown in FIG. 5 (A), when the wireless power supply link has been interrupted, a loss occurs in the emitted power received by the laser power receiving device 150, and the laser power transmitting device 110 is notified of the lower than expected amount of power received. In this situation, the laser power transmitting device 110 can compare the reported amount of power received to the amount of power transmitted by the device itself, detect an anomaly in the wireless power supply link, and immediately stop laser emission.

FIG. 5 (B) shows the processing flow from the detection of an anomaly that has occurred due to a malfunction in the wireless communication link to the stopping of the laser. As shown in FIG. 5 (B), the proper amount of power is received by the laser power receiving device 150 even when the wireless communication link is interrupted, but the amount of power received is not transmitted to the laser power transmitting device 110. In this situation, the laser power transmitting device 110 determines that it cannot receive the amount of power received in a predetermined amount of time, can determine that there has been an anomaly in the wireless communication link, and can immediately stop laser output.

In the embodiment shown in FIG. 2 through FIG. 5, the amount of power received is continuously transmitted from the laser power receiving device 150 to the laser power transmitting device 110 via the wireless communication link. At this time, there is no need for communication from the transmitter to the receiver in order for the transmitter to learn the amount of power received. Therefore, in the embodiment described above, the response delay time evaluated when the maximum permissible value is calculated may utilize one-way latency from the laser power receiving device 150 to the laser power transmitting device 110. In the embodiment shown in FIG. 2 through FIG. 5, this is preferable from the standpoint of reducing the reaction time since communication is performed over a one-way link.

After link confirmation, the laser power transmitting device 110 no longer has to transmit data in order to detect an anomaly. Therefore, after link confirmation, the link in the transmission direction can be stopped by the wireless data communication unit 120 to save power. In an embodiment that omits the initial link confirmation, a link in the transmission direction can be eliminated from the wireless data communication unit 120 altogether.

In the embodiment described above, the laser power transmitting device 110 received the amount of power received via the wireless communication link to detect an anomaly. However, the anomaly detection method is not limited to the example described above. The following is an explanation of another embodiment in which anomaly detection is performed by the laser power receiving device 150 with reference to FIG. 6 and FIG. 7.

Figure 6:
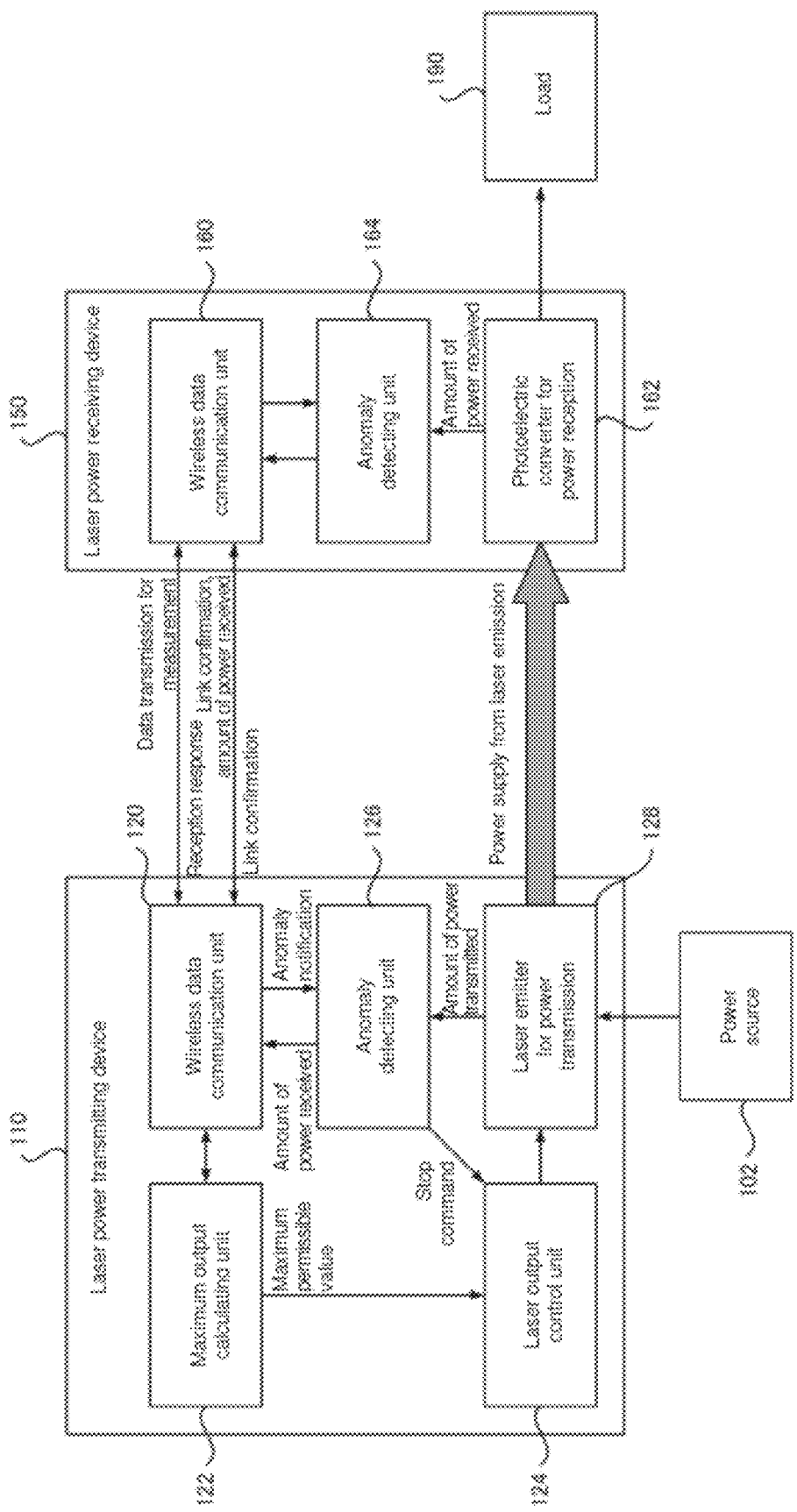
FIG. 6 is a diagram showing the function blocks and data flow for a laser power transmitting device and laser power receiving device in a laser power supply system according to another embodiment of the present invention.

FIG. 6 is a diagram showing the function blocks and data flow for a laser power transmitting device 110 and laser power receiving device 150 in a laser power supply system 100 according to another embodiment of the present invention. The configurational element identical to those in the embodiment shown in FIG. 2 are denoted by the same numbers. The following explanation will focus on the points of difference.

The laser power transmitting device 110 shown in FIG. 6 includes a wireless data communication unit 120, a maximum output calculating unit 122, a laser output control unit 124, an anomaly detecting unit 126, and a laser emitter for power transmission 128. In addition to a wireless data communication unit 160 and a photoelectric converter for power reception 162, the laser power receiving device 150 shown in FIG. 6 includes an anomaly detecting unit 164. Wireless communication units 120 and 160, the maximum output calculating unit 122, the laser output control unit 124, the laser emitter for power transmission 128, and the photoelectric converter for power reception 162 have the same roles as the same configurational elements in the embodiment explained with reference to FIG. 2.

As in the embodiment described above, the anomaly detecting unit 126 in the laser power transmitting device 110 monitors the state of the wireless power supply link and detects the occurrence of anomalies based on data communication with the laser power receiving device 150 via the wireless communication link. However, in the embodiment shown in FIG. 6, anomalies in the wireless power supply link are detected using a method different from that of the embodiment shown in FIG. 2.

First, the laser power transmitting device 110 acquires the amount of power transmitted from the laser emitter for power transmission 128, and sends the acquired amount of power transmitted to the laser power receiving device 150 via the wireless data communication unit 120. The anomaly detecting unit 164 in the laser power receiving device 150 compares the amount of power received which is acquired from the photoelectric converter for power reception 162 to the amount of power transmitted which is reported by the laser power transmitting device 110 in order to determine from the results whether the loss is equal to or greater than a predetermined threshold value.

When the loss is equal to or greater than a predetermined threshold value, it is determined that an anomaly has occurred in the wireless power supply link. In this situation, the laser power receiving device 150 reports the occurrence of an anomaly to the laser power transmitting device 110 via the wireless data communication unit 160. The anomaly detecting unit 126 in the laser power transmitting device 110 receives the report of an anomaly from the laser power receiving device 150, and determines that an anomaly has occurred in the wireless power supply link.

Figure 7:
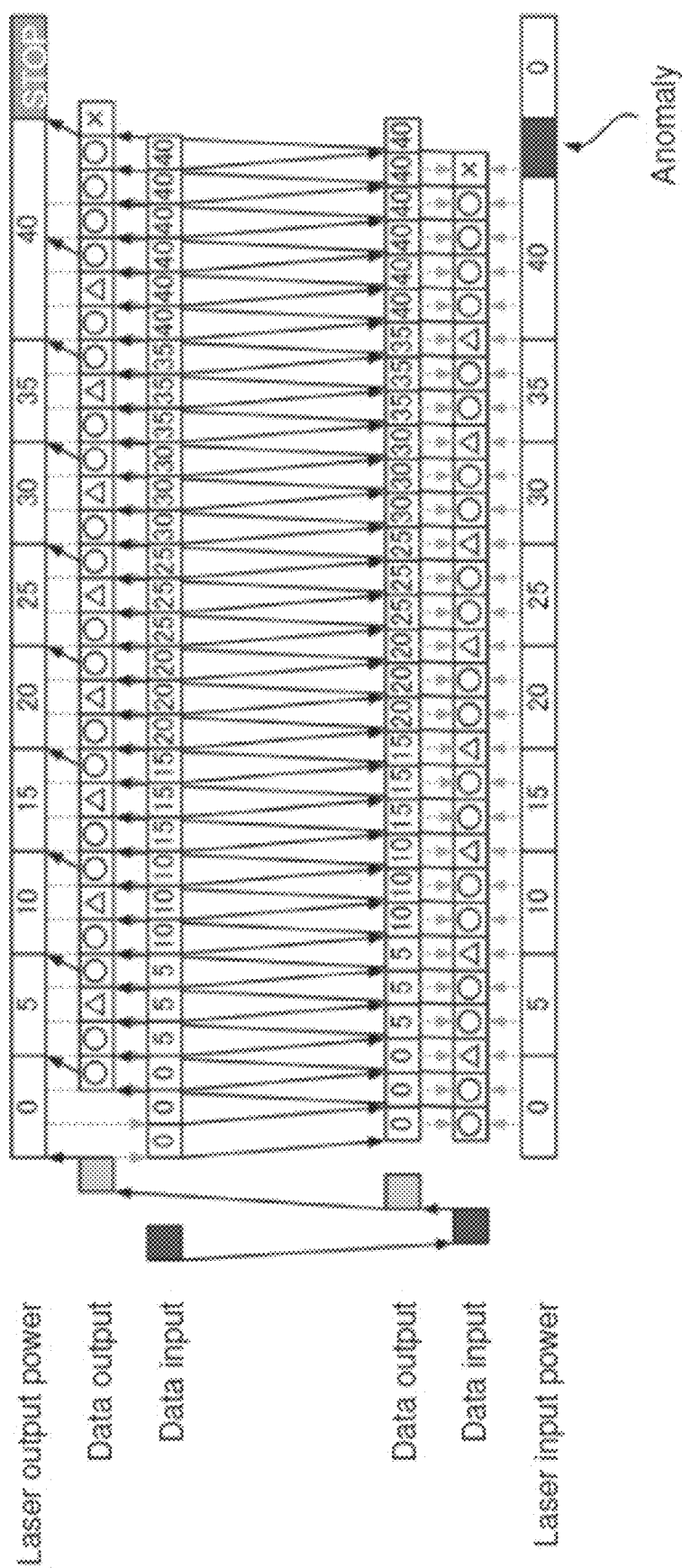
FIG. 7 is a diagram schematically illustrating the relationship to laser output of the exchange of information between the laser power transmitting device and the laser power receiving device and the timings thereof in another embodiment of the present invention.

FIG. 7 is a diagram schematically illustrating the relationship to laser output of the exchange of information between the laser power transmitting device 110 and the laser power receiving device 150 and the timings thereof in another embodiment of the present invention. First, the laser power transmitting device 110 uses the data communication unit 120 to output a wireless communication link confirmation to the laser power receiving device 150 (indicated by the black squares in FIG. 7). When the link confirmation has been received, the laser power receiving device 150 outputs a wireless communication link response to the laser power transmitting device 110 (indicated by the gray squares in FIG. 7). When the link response has been received, the laser power transmitting device 110 starts sending the amount of power transmitted to the laser power receiving device 150 (indicated by the numbered squares in FIG. 7).

The laser power receiving device 150 receives notification of the amount of power transmitted from the laser power transmitting device 110, compares the received amount of power transmitted to the actual amount of power received to determine whether the power has been transmitted adequately, and returns the results of the determination to the laser power transmitting device 110. When determination results indicating that the power has been transmitted adequately are received, the laser power transmitting device 110 uses the laser output control unit 124 to increase the laser output in stages within a range that does not exceed the maximum permissible value.

FIG. 7 also shows the processing flow from the detection of an anomaly that has occurred due to an interruption in the wireless power supply link to the stopping of the laser. As shown in FIG. 7, when the wireless power supply link has been interrupted, a loss occurs in the emitted power received by the laser power receiving device 150, and the amount of power received is less than expected based on the reported amount of power transmitted. When the laser power receiving device 150 has detected the occurrence of an anomaly, the occurrence of an anomaly is reported to the laser power transmitting device 110. The laser power transmitting device 110 detects an anomaly based on this report, and can immediately stop the laser emission.

In the other embodiment described above, the amount of power transmitted is continuously sent via the wireless communication link from the laser power transmitting device 110 to the laser power receiving device 150. The determination results are reported by the laser power receiving device 150 to the laser power transmitting device 110 via the wireless communication link. At this time, two-way communication occurs in order for the transmitter to detect anomalies. Therefore, the response delay time evaluated when calculating the maximum permissible value may utilize round-trip latency.

Figure 8:
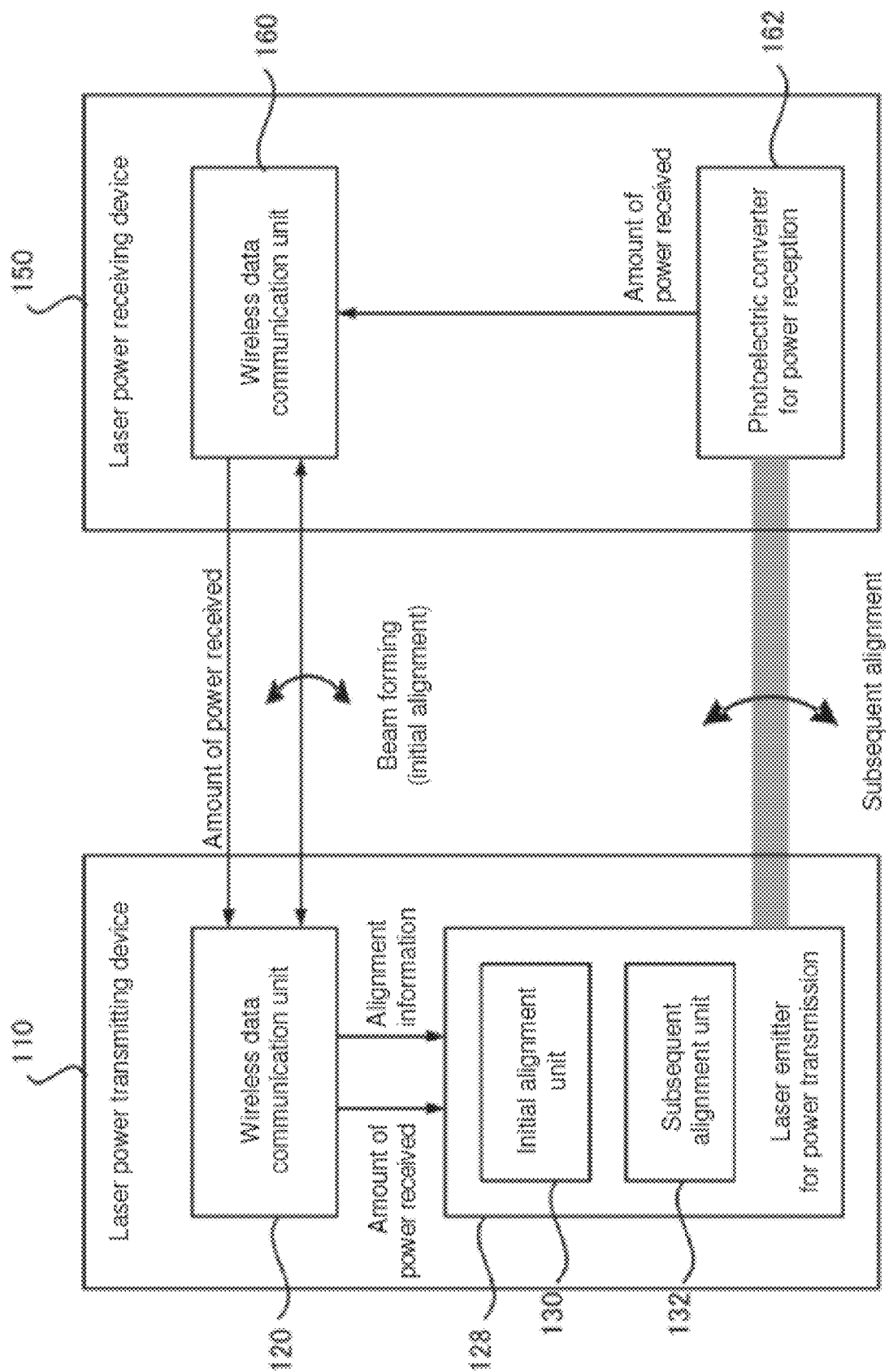
FIG. 8 is a function block diagram related to the alignment of the wireless communication link and the wireless power supply link in an embodiment of the present invention.
Figure 9:
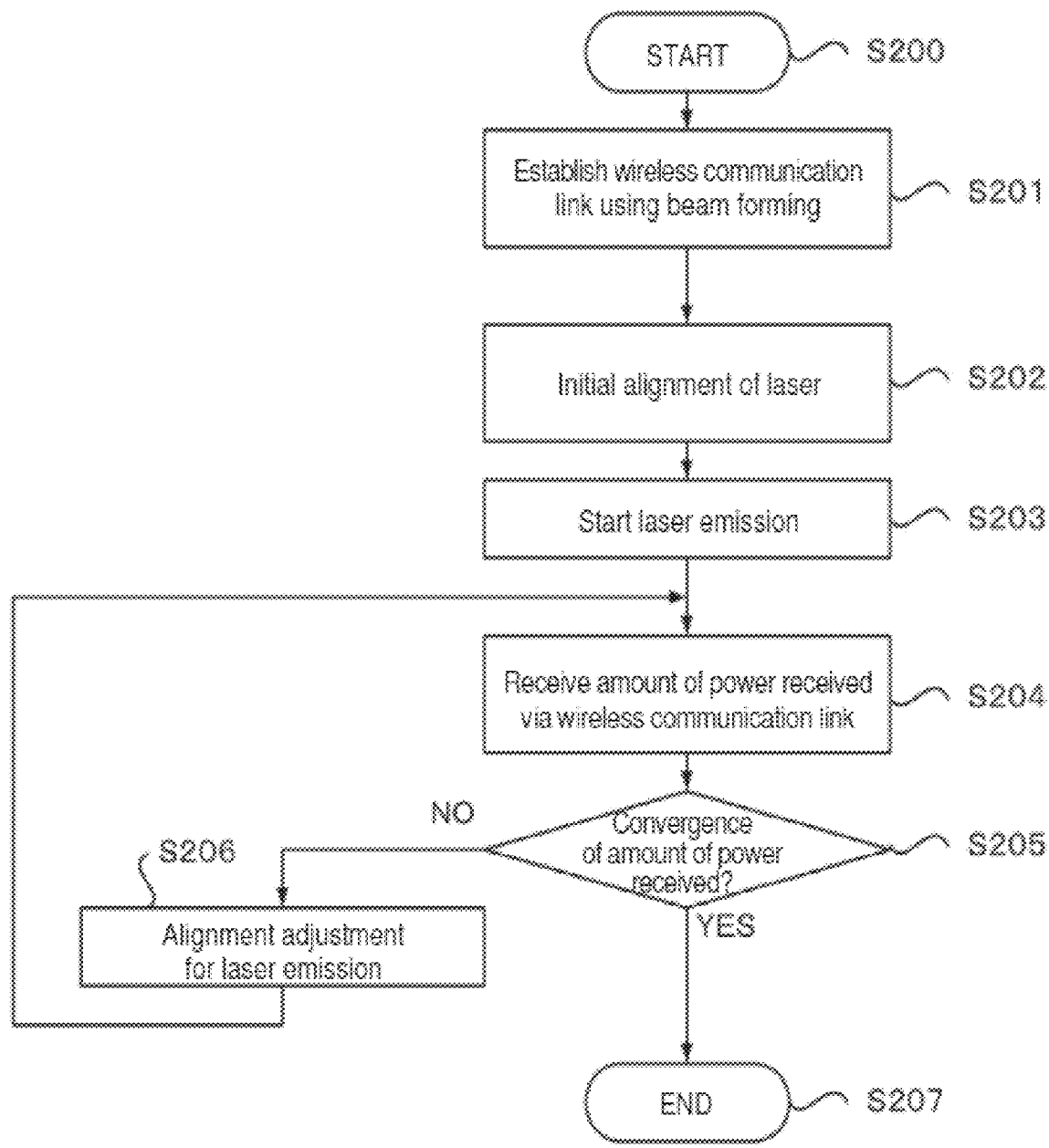
FIG. 9 is a flowchart showing the alignment controls performed by the laser power transmitting device in an embodiment of the present invention.

The following is a detailed explanation of alignment of the wireless communication link and wireless power supply link between the power transmitting device 110 and the power receiving device 150 with reference to FIG. 8 and FIG. 9. FIG. 8 is a function block diagram related to the alignment of the wireless communication link and the wireless power supply link in an embodiment of the present invention.

As shown in FIG. 8, the laser emitter for power transmission 128 includes an initial alignment unit 130 and a subsequent alignment unit 132. The initial alignment unit 130 performs rough alignment of the wireless power supply link via the establishment of a wireless communication link between wireless data communication units 120 and 160. The subsequent alignment unit 132 then performs fine adjustments on the alignment of the wireless power supply link based on the results of the rough adjustments performed by the initial alignment unit 130 and feedback from the laser power receiving device 150 via the wireless communication link.

In a preferred embodiment, wireless data communication units 120 and 160 can be equipped with a beam-forming antenna such as the active array antenna mentioned above. A beam-forming antenna includes a plurality of antenna elements. Different-phase signals are inputted to each antenna element, and the antenna is able to control the directionality of the beam by synthesizing the signals in space. When a beam-forming antenna is used, the orientation of the beam can be changed electronically using phase control. There are no particular restrictions on how beam forming is implemented. It may be implemented using the radio frequency (RF) front end, or digital signal processing.

Because the directionality of the wireless communication link is optimized by beam forming via the establishment of a wireless communication link, alignment information (phase information) is obtained which defines directionality. The initial alignment unit 130 acquires this alignment information from the wireless data communication unit 120, and determines the initial value for the direction of laser emission based on the acquired alignment information. In this way, the subsequent alignment can be started from a state in which the direction of laser emission has been roughly adjusted.

The laser power transmitting device 110 emits the laser from the laser emitter for power transmission 128 after initial adjustment. The laser power receiving device 150 receives the laser emission using the photoelectric converter 162, and sends, as feedback, the amount of power received to the laser power transmitting device 110 using the wireless data communication unit 160. The subsequent alignment unit 132 optimizes the direction of laser emission in a direction that will improve the amount of power received based on the feedback on the amount of power received.

Typically, the direction of laser emission is determined by mechanically controlling the orientation of a reflective mirror installed outside of the laser element, and deflecting the beam emitted by the laser element using the reflective mirror. Instead of external optics, a semiconductor layer may be used in which the beam exit direction can be controlled by a laser resonator using a photonic crystal.

FIG. 9 is a flowchart showing the alignment controls performed by the laser power transmitting device 110 in an embodiment of the present invention. The processing shown in FIG. 9 starts from Step S200 in response to being called in Step S101 shown in FIG. 4. In Step S201, the laser power transmitting device 110 establishes a wireless communication link with the laser power receiving device 150 using beam forming. In the embodiment explained here, the wireless communication link is established prior to the supply of power. The power needed by the laser power receiving device 150 prior to the wireless supply of power may be drawn from another suitable means such as a secondary battery charged previously by the supply of wireless power or a primary battery installed in the laser power receiving device 150.

In Step S202, the laser power transmitting device 110 uses the initial alignment unit 130 to roughly align the wireless power supply link based on alignment information obtained as a result of beam forming. In Step S203, the laser power transmitting device 110 starts the emission of the laser from the laser emitter for power transmission 128.

In Step S204, the laser power transmitting device 110 uses the wireless data communication unit 120 to receive the amount of power received from the laser power receiving device 150 via the wireless communication link. In Step S205, the subsequent alignment unit 132 is used to determine whether predetermined convergence conditions have been met. Here, the convergence conditions are used to determine the emission direction for the maximum amount of power received and to terminate the process.

When it has been determined in Step S205 that there has been no convergence in the amount of power received (NO), the control process branches to Step S206. In Step S206, the laser power transmitting device 110 adjusts the direction of laser emission by adjusting the two-axis tilt angle of the reflective mirror, and loops the control process to Step S204. When it has been determined in Step S205 that there has been convergence in the amount of power received (YES), the control process branches to Step S207, the process is ended, and the system returns to the original control process shown in FIG. 4. As a result, alignment of the wireless communication link and wireless power supply link between the power transmitting device 110 and the power receiving device 150 is ended.

Figure 11:
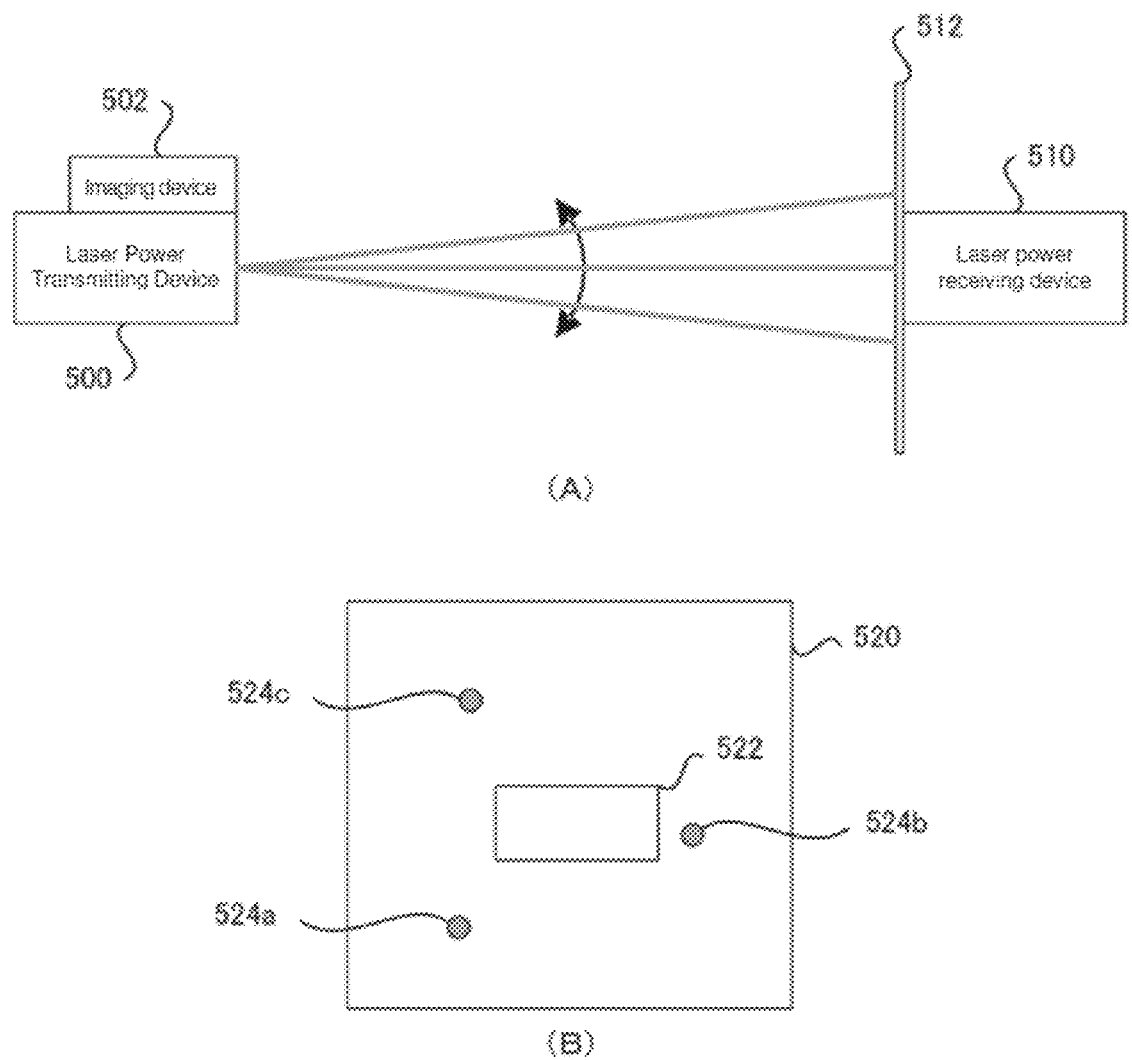
FIG. 11 is a diagram used to explain laser emission alignment in the prior art.

FIG. 11 is a diagram used to explain laser emission alignment in the prior art. A laser beam typically has a spot diameter of several dozen micrometers or less. A laser beam emitted from a laser power transmitting device 500 with high directionality is difficult for the laser power receiving device 510 to observe and align. In the prior art shown in FIG. 11, a reflective panel 512 having a predetermined width is installed on the laser power receiving device 510, and the laser beam reflected by the reflective panel 512 is observed and finely adjusted using an imaging device 502 installed in the laser power transmitting device 500.

Therefore, the position of the beam spot 524 observed in an image 520 on the imaging device 502 has to be detected using image processing while adjusting the direction of laser emission so that the beam spot is within the light-receiving region 522 of the laser power receiving device 510. This image process is resource-intensive and requires a reflective panel, thus increasing instrumentation costs.

In contrast, rough alignment is performed in the embodiments described above via beam forming using the wireless communication link described above to roughly fit the beam spot into the light-receiving region. After the rough alignment has been completed, the power transmitting device 110 performs fine adjustments by receiving feedback via the wireless communication link on the actual amount of power received by the power receiving device 150. As a result, a reflective panel 512, imaging device 502 and image processing IC are not required, thus holding down any increase in instrumentation costs.

Figure 10:
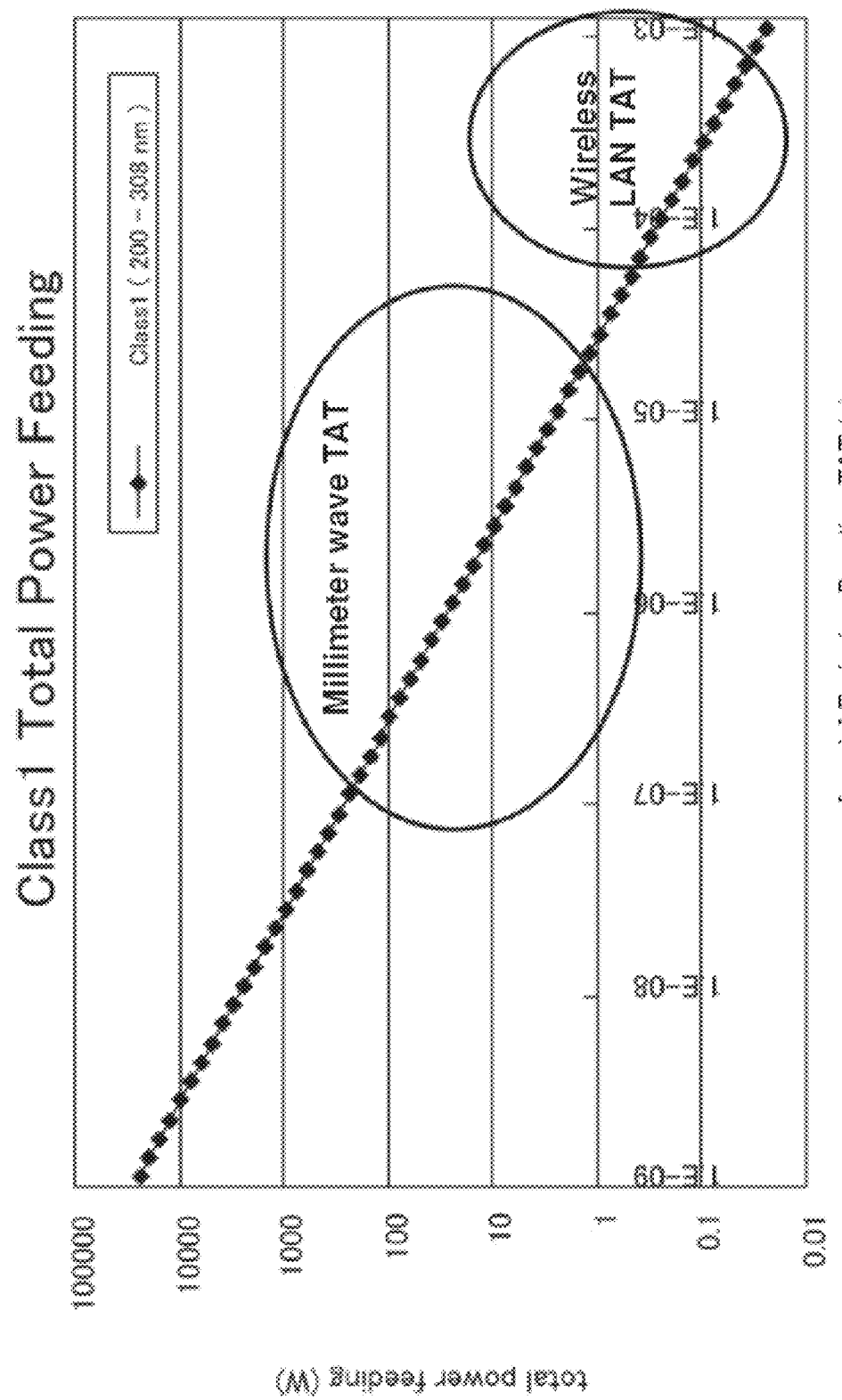
FIG. 10 is a graph in which total power feeding (W) that meets Class 1 safety standards has been plotted with respect to emission duration (s).

The following is an explanation with reference to FIG. 10 of power which can be supplied using a configuration in which anomalies are detected on the basis of data communication via the wireless communication link described above, and the laser output of the wireless power supply link is controlled in response to the occurrence of an anomaly.

As described above, the reaction time (turnaround time or TAT) from the occurrence of an anomaly to the reduction in laser output can be shortened to the extent that the response delay time of the wireless communication link is shortened. Thus, laser emission can be achieved at a higher output under conditions meeting exposure standards to the extent that the response delay time is shortened. FIG. 10 is a graph in which total power feeding (W) that meets Class 1 safety standards according to JIS C 6802 has been plotted with respect to emission duration (s). The following explanation will specifically use Class 1, but this is for illustrative purposes only. There are no restrictions on class.

According to Annex I (Exposure Limits Related to Class 1 Laser Devices) of the Measures For Preventing Damage Due to Laser Beams published by the Japan Advanced Information Center of Safety and Health (http://anzeninfo.mhlw.go.jp/anzen/hor/hombun/hor1-29hor1-29-16-1-0.htm), the accessible emission limit (AEL) in Class 1 is $2.4 \times 10^{-5}$ J at an emission duration of $t > 10^{-9}$ s and at a wavelength from 200 to 302 nm. When the reaction time (TAT) up to the point where laser emission is stopped is T [s], this T [s] becomes the emission duration. Because the upper limit on the emission duration T [s] is $2.4 \times 10^{-5}$ J, the emitted energy (emitted output) per second during T [s] is $2.4 \times 10^{-5}/T$ [W]. It is clear from FIG. 10 that the amount of power supplied increases as the reaction time T decreases under conditions meeting exposure standards.

As shown in FIG. 10, the TAT for wireless LAN communication in frequency bands 2.4 GHz and 5 GHz range from $1.0 \times 10^{-4}$ to $1.0 \times 10^{-3}$ s according to IEEE 802.11 (The Institute of Electrical and Electronics Engineers, Inc.). In these frequency bands, the directionality is limited and the TAT lengthens as latency is increased due to the Carrier Sense Multiple Access/Collision Detection (CSMA/CD) method. In the CSMA/CD method, efficiency declines significantly as the number of connected clients increases. In an actual environment, therefore, the TAT of wireless LAN is in the range of several dozen ms. Therefore, when a wireless LAN communication link is used, the limit is 1 mW in an actual environment under the Class 1 standards.

Millimeter waves have a frequency from 30 to 300 GHz, and millimeter wave wireless communication is typically known to use the 60 GHz frequency band. However, electromagnetic waves in these frequency bands have high directionality and can form a direct link, thereby reducing the response delay time after the establishment of the link. Also, millimeter wave wireless communication in which a direct link is formed has a shorter TAT than wireless LAN communication using the CSMA/CD method described above, and the method does not cause an increase in latency.

As shown in FIG. 10, the millimeter wave TAT can be in the range of $1.0 \times 10^{-6}$ [s]. Therefore, the supply of approximately 10 W of power can be anticipated even under Class 1 standards. If power could be supplied in watt units, the power consumption needs of various loads could be satisfied, and the range of devices using a wireless power supply could be increased. By using recently developed millimeter wave wireless communication or terahertz wave communication in a frequency band higher than presently used (at a frequency from 100 GHz to 10 THz), response times TAT can be further reduced, and the supply of power at even higher outputs can be anticipated.

Because a direct link is formed in millimeter wave wireless communication and the wireless communication link can be continuously maintained between wireless stations, it is advantageous to stably maintain the response delay time described above during laser emission. Also, in millimeter wave wireless communication, the directionality with the station on the other end of the direct link is optimized using beam forming, and the response delay time is continuously being optimized. Because millimeter waves have greater directionality than electromagnetic waves with a long wavelength, the alignment process using beam forming described above is performed more advantageously.

In the embodiments of the present invention explained above, a power transmitting device, power receiving device, power supply system and power supply method can be provided which are able to transmit power via the emission of electromagnetic waves while also meeting standards for exposure that is likely to occur when an anomaly occurs. The embodiments of the present invention are also able to increase the power transmission output via the emission of electromagnetic waves while also meeting standards for exposure that is likely to occur when an anomaly occurs.

The configuration of the embodiments described above allows the power cable between a commercial power source and a power receiving device (the "last wire") to be eliminated. The power receiving device can be any device able to receive a supply of power via the emission of electromagnetic waves and supply the received power to a load. Preferred examples of power receiving devices include electronic devices for which the cost of installing a land line is high, such as projectors and monitoring cameras installed in high places that can be access points for millimeter wave wireless communication. Because the supply of large amounts of power can be anticipated from wireless power feeds using the magnetic field resonance method, these power receiving devices may also be devices consuming a large amount of power such as personal computers, tablet computers, and mobile phones. Relay devices may also be configured to relay wireless data communication and the wireless supply of power. These devices have the configuration of both power receiving devices and power transmitting devices.

Some or all of the functional components can be installed in a programmable device (PD) such as a field-programmable gate array (FPGA) or integrated into an application-specific integrated circuit (ASIC), and the circuit configuration data (bit stream data) downloaded to the PD such that said functional components may be realized on the PD and data written in HDL (hardware description language) VHDL (VHSIC (Very high-speed integrated circuit) hardware description language) and Verilog-HDL, etc., for generating the circuit configuration data can be distributed via a storage medium.

In the embodiments of the present invention, the maximum permissible exposure (MPE) and the accessible emission limit (AEL) were explained as an example. There are no particular restrictions on the exposure standards. The exposure standards include any type of exposure. In addition to exposure of the human body to electromagnetic waves, the exposure standards may include exposure of animals and objects to electromagnetic waves. The exposure standards may also be standards defining the acceptable amount of exposure or amount of exposure recommended as an upper limit for any of these types of exposure.

The present invention was explained with reference to embodiments. However, the present invention is not limited to the embodiments explained above. The present invention can be altered in any way conceivable by a person skilled in the art, including other embodiments, additions, modifications, and deletions. Any aspect realizing the actions and effects of the present invention is within the scope of the present invention.

KEY TO THE DRAWINGS

100: Laser power supply system
102: Power source

110: Laser power transmitting device
112: Antenna
114: Laser element
120: Wireless data communication unit
122: Maximum output calculating unit
124: Laser output control unit
126: Anomaly detecting unit
128: Laser emitter for power transmission
130: Initial alignment unit
132: Subsequent alignment unit
150: Laser power receiving device
152: Antenna
154: Photoelectric conversion element
160: Wireless data communication unit
162: Photoelectric converter for power reception
164: Anomaly detecting unit
190: Load

What is claimed is:

1. A power supply method executed between a power transmitting device able to transmit power by emitting electromagnetic waves, and a power receiving device able to receive power supplied by the power transmitting device, the power supply method comprising the steps of:

evaluating the response delay time for communication via a wireless communication link between the power transmitting device and the power receiving device, wherein each of the power transmitting device and the power receiving device is capable of transmitting data through the wireless communication link;

calculating a maximum value for the emitted output of electromagnetic waves meeting exposure standards on the basis of a response delay time, wherein the emission of electromagnetic waves has directionality, and wherein the calculating includes calculating the maximum value for the emission output of electromagnetic waves on the basis of conditions preventing a predetermined exposure level from being exceeded when electromagnetic waves are emitted at a maximum value over a reaction period at least including the response delay time;

and causing the power transmitting unit to transmit power via a power supply link with the power receiving device at an output not exceeding the maximum value, wherein causing the power transmitting unit to transmit power via a power supply link is by an output control unit;

the power supply method further comprising the steps of:

detecting an anomaly in the power supply link on the basis of communication with the power receiving device via the communication link, wherein detecting an anomaly in the power supply link is by an anomaly detecting unit; and causing the power supply device to limit the output of the power supply link on the basis of the detection of an anomaly in the power supply link, wherein the output control unit limits the output in response to an occurrence of an anomaly in at least either the wireless communication link or the power supply link, and wherein the output limiting includes causing the power transmitting device to stop the emission output of electromagnetic waves in the power supply link in response to the detection of the anomaly in the power supply link.

* * * * *